United States Patent [19]

DeSanto

[11] Patent Number: 5,612,680
[45] Date of Patent: Mar. 18, 1997

[54] UNIVERSAL TERMINATION MODULE FOR ASSEMBLING WIRE HARNESSES HAVING MULTIPLE DIVERSE CONNECTORS

[76] Inventor: Joseph J. DeSanto, 14 Hillcrest Rd., Belle Mead, N.J. 08502

[21] Appl. No.: 414,781

[22] Filed: Mar. 31, 1995

[51] Int. Cl.[6] .............................. G08B 5/22; B23P 19/00
[52] U.S. Cl. ...................... 340/815.45; 29/755; 29/854; 439/248; 324/66
[58] Field of Search ...................... 340/815.45; 29/754, 29/755, 854; 439/248, 411, 418, 404, 712; 324/66, 67; 327/30, 37, 38

[56] References Cited

U.S. PATENT DOCUMENTS

| | | | |
|---|---|---|---|
| 3,407,480 | 10/1968 | Hill et al. | 29/593 |
| 3,769,701 | 11/1973 | Kloth | 29/624 |
| 4,711,025 | 12/1987 | DeSanto | 29/854 |
| 4,920,636 | 5/1990 | Eck | 29/747 |
| 4,921,435 | 5/1990 | Kane et al. | 29/854 |
| 4,951,385 | 8/1990 | DeSanto | 29/754 |
| 4,979,544 | 12/1990 | Swindlehurst | 29/755 |

*Primary Examiner*—Donnie L. Crosland
*Attorney, Agent, or Firm*—Richard C. Woodbridge

[57] ABSTRACT

A wire harness assembly system permits a wide variety of different electrical wire harnesses to be assembled with different harness connectors but employing the same termination modules. The wire harnesses are assembled on a wiring board surface which includes guides to hold the wires in position. Each end of each wire in the wire harness is intended to terminate in a first or harness multiconductor connector. Each first multiconductor connector mates with a second multiconductor connector which is received in each termination module. Each termination module includes an LED light array and an array of spring-loaded contact pins which selectively engage with the conductor pins in the mating second connector. An electronic controller or test system is connected to each of the universal termination modules and controls the lighting of the LED array and the testing of the spring-loaded pins. Each universal termination module can accommodate a wide variety of different connectors by changing the face plate. Each face plate has a unique set of apertures for the LED array and a unique plug configuration which only conforms to a particular connector. According to an alternative embodiment, the face plate may incorporate a permanent second connector to mate with the first connector on the wire harness.

20 Claims, 3 Drawing Sheets

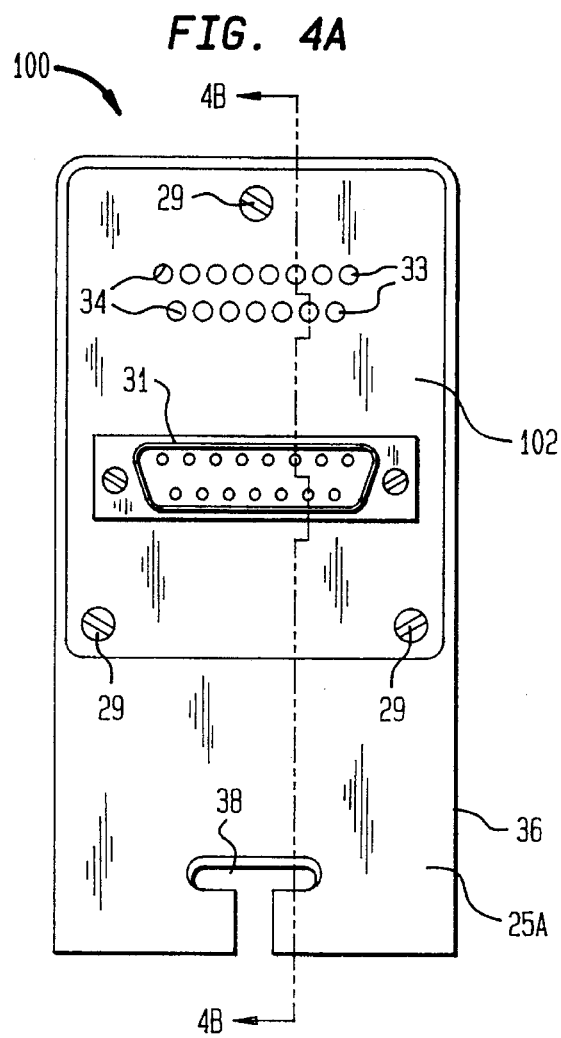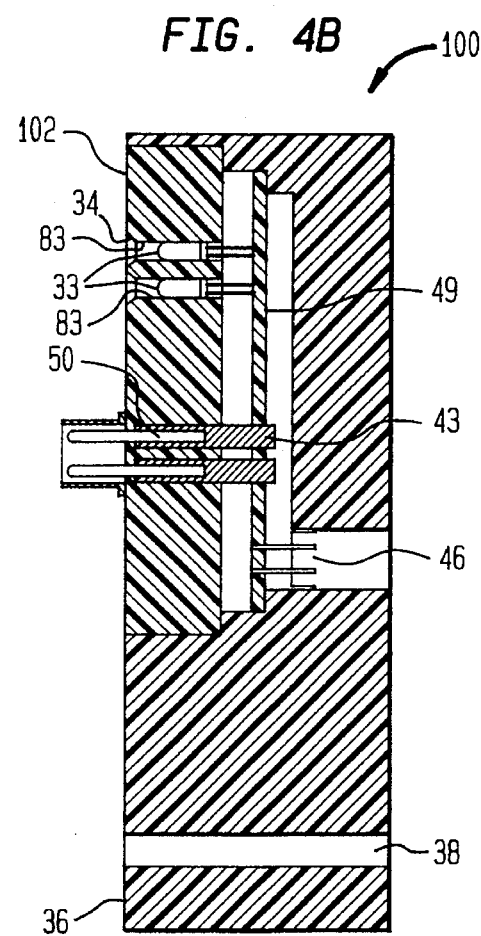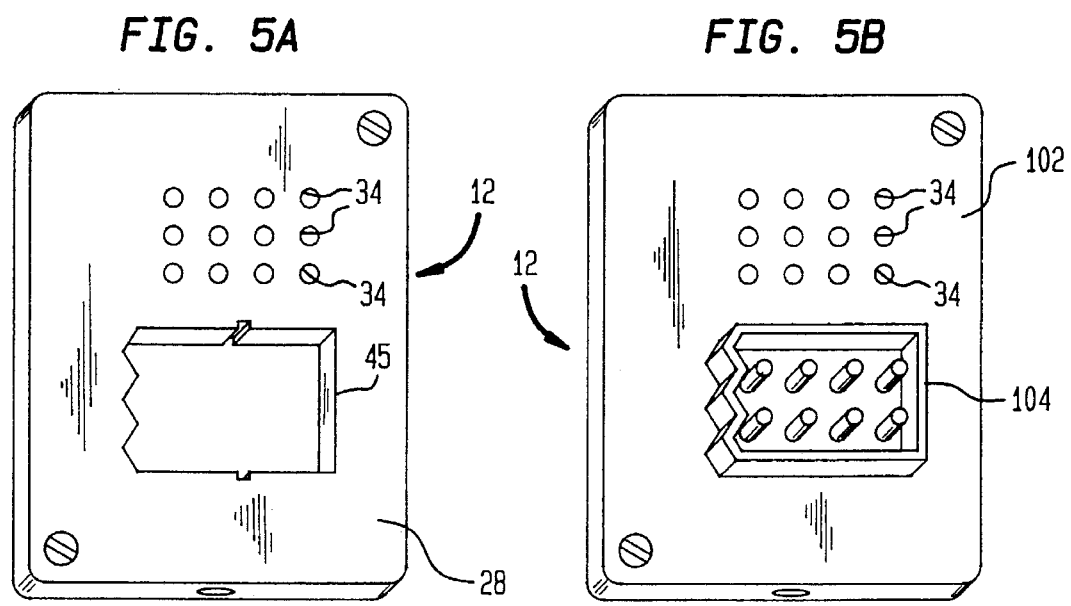

5,612,680

UNIVERSAL TERMINATION MODULE FOR ASSEMBLING WIRE HARNESSES HAVING MULTIPLE DIVERSE CONNECTORS

BACKGROUND OF THE INVENTION

1. Field of the Invention

This invention relates, generally, to wiring methodology and an inter-connecting apparatus for manufacturing electrical wire harnesses and, more specifically, it relates to a system in which universal termination modules can be employed to mate and interact with a wide variety of commercially available wire harness connectors.

2. Description of Related Art

The task of arranging electrical and physical connections between a test system and a wire harness is made more complicated by the very large number of different types of connectors used in the industry to make harnesses. The expense of making multiple terminators rules out the use of such technology on short production runs, since the cost of the terminators may be greater than the benefit incurred. Generally, heretofore, mating test connectors had to be hand wired and tied to the appropriate locations. Attempts have been made to improve on this interface problem. See, for example, my prior U.S. Pat. No. 4,951,385 which describes a method by which standard cables can be plugged into modules which permits an active interface between the harness being assembled and the test system. By plugging different modules into the test system, different wire harnesses can be assembled and tested. See also my previous U.S. Pat. No. 4,711,025.

One problem incurred with this approach is the expense involved because of the large number of termination modules required for each different type of harness to be assembled. There are potentially thousands of different kinds of termination connectors presently available in the marketplace and most wiring houses have to deal with, perhaps 600–800, of such connectors routinely. Accordingly, a universal termination module that could be employed with a wide variety of different connector manufacturers series of connectors would be a major step forward. It would reduce the labor involved in manufacturing wire harnesses and, of course, the related cost.

The prior art does not appear to disclose a practical universal terminator that can be employed for the purposes above described. In that regard note, for example, the possibly relevant teachings in the following U.S. Pat. Nos. 3,407,480; 3,769,701; 4,920,636; and, 4,921,435. U.S. Pat. No. 4,979,544 entitled UNIVERSAL WIRE FORM BOARD ASSEMBLY is also of possible relevance in that it touches upon the concept of universality. It deals, however, more with the details of the physical wire routing and/or the bending of wires to form a harness rather than the issue of multi-connector, universal terminators.

Insofar as the prior art is understood and identifiable, there appears to be no teaching or suggestion of a practical universal harness terminator module that can be used with a wide variety of different wire harness cable connectors.

SUMMARY OF THE INVENTION

Briefly described, the invention comprises a method and apparatus for significantly reducing the number of termination modules required by a wire harness manufacturer in order to economically and efficiently produce a number of different electrical wire harnesses. The invention comprehends the use of a wiring surface board which holds the wires in position and routes them to various different universal termination modules. Hook and loop fasteners are employed to selectively attach the universal termination modules to the board. An electronic controller test system is connected to each of the universal termination modules. Each module includes an LED light array and an array of spring-loaded push pins. Each module can accept one of a plurality of different face plates. According to the preferred embodiment, each face plate includes a connector docking aperture for receiving one of two mating sections of a wire harness connector and a plurality of holes which permit selected LEDs in the array to be viewed. The number of viewable LEDs corresponds to the number of conductors to be wired. The portion of the connector that is received in the connector docking aperture in the face plate contacts selected ones of the spring-loaded push pins so that an electrical contact is made from the electronic controller test system through the universal termination module and its associated spring-loaded push pins to the connector half in the docking aperture. The mating section of the harness connector is plugged into the terminator connector portion that is received in the docking aperture of the universal termination module. The electronic controller illuminates selected LEDs to tell the wire harness assembler where to connect each wire. It ultimately also tells the assembler whether each wire has been correctly connected once the wire harness is completely assembled when the electronic controller test system is in its test mode. According to an alternative embodiment of the invention, the portion of the termination module connector that is received in the face plate docking aperture is permanently affixed to the face plate.

These and other features of the present invention will be more fully understood by reference to the following drawings.

BRIEF DESCRIPTION OF THE DRAWINGS

FIG. 4A is a front, elevational view illustrating details of an alternative embodiment of the universal termination module in which termination module connector is permanently attached to the interchangeable face plate.

FIG. 4B is a side, cross-sectional view of the alternative embodiment shown in FIG. 4A.

FIG. 5A illustrates a face plate panel insert with a commercially available 12 pin Molex connector, Series 03-09-xxxx, according to the preferred embodiment.

FIG. 5B illustrates a face plate panel insert with a commercially available 12 pin Molex connector, Series 03-09-xxxx, according to the alternative embodiment.

DETAILED DESCRIPTION OF THE PREFERRED EMBODIMENT

During the course of this description, like numbers will be used to refer to like elements according to the different figures which illustrate the invention.

Figure 1:
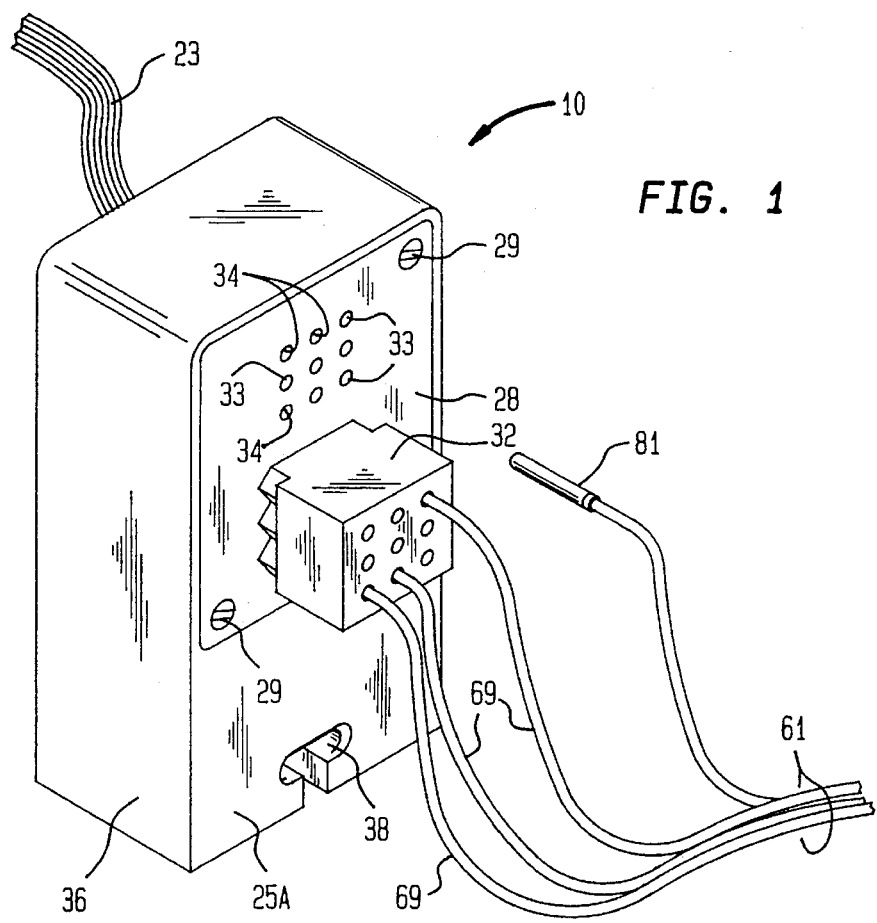
FIG. 1 illustrates the preferred embodiment of the universal termination module invention.

The preferred embodiment of the universal termination module invention 10 is illustrated in FIG. 1. For the sake of convenience certain elements will be referred to using the same terminology and numbering system as is found in my U.S. Pat. No. 4,951,385, the entire text and contents of which are hereby incorporated by reference into this disclosure.

The termination module 10 is considered universal because it will connect with and electrically interface with all of the connectors within a manufacturer's series, including all different numbers of pin combinations, whether male or female. The universality depends solely upon the pin-to-pin spacing of the connector series and the diameter of the pin which will be inserted into the connector while wiring the harness. Further, both the master block 25A and the interchangeable face plate panel insert 28 have been molded using plastic resin. A harness connector 32 is shown in FIG. 1 being wired with wires 69 to make an electrical harness 61. Securing screws 29 are used to hold the different, connector specific, face plate panel inserts 28 into place and allow for ease of changeover from one connector type to an other for a different harness. The insert shown in FIG. 1 is part of a Molex Series #03-09. Molex is a registered trademark of Molex, Incorporated with its corporate headquarters located at 2222 Wellington Ct., Lisle, Ill. 60532. The Molex Series has a maximum of 15 pins arranged in a 5×3 pattern and likewise the master terminator block 36 for this series has 15 test circuits as well as 15 LEDs 33. Since the connector being used has only 9 pins, the face plate panel insert 28 has been made to cover or hide the unused test circuits and LEDs 33. This methodology will be discussed in more detail when discussing FIG. 3A and 4A. It should be noted that not all test systems can drive the LEDs 33 and in these cases it will be necessary to manufacture the Master blocks and inserts without LEDs. A ¼-20 carriage bolt (not shown) is used in conjunction with lock down slot 38 to secure the universal terminator module 10 to the wiring board surface 54 in FIG. 2.

Figure 2:
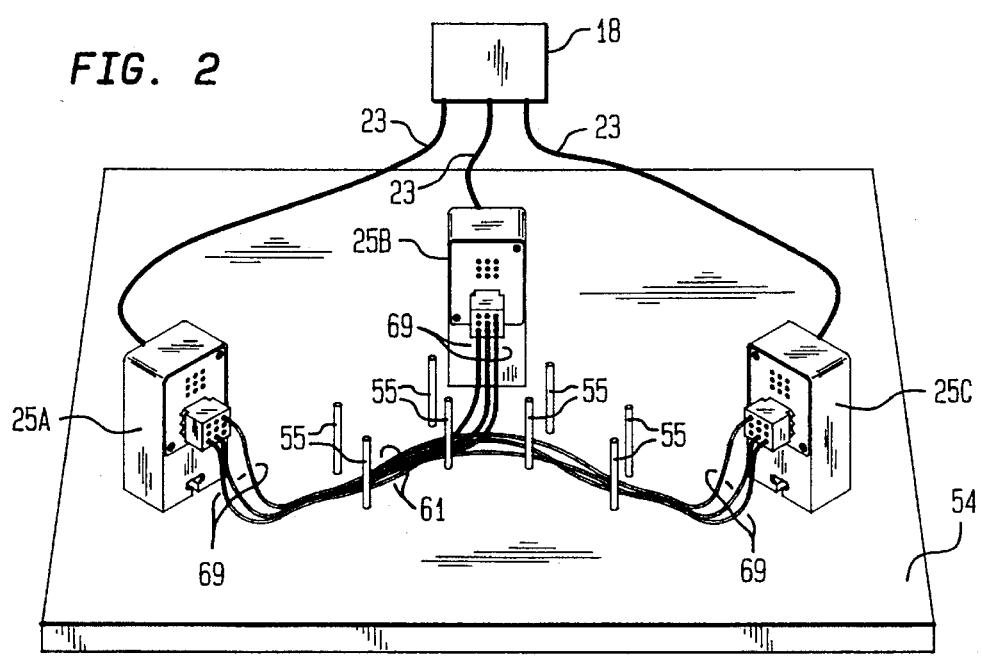
FIG. 2 is a top plan illustrating a wiring board incorporating the preferred embodiment of the universal termination module shown in FIG. 1.

FIG. 2 illustrates a number of terminators 25A, 25B and 25c arranged in a manner to make a harness 61. Guide posts 55 are used to hold the wires in place on the wiring surface 54. Also shown are three cables 23 connecting the terminators 25A, 25B and 25C into the multiplexer bus of the electronic controller test system 18. Terminator 25A, as discussed above, is shown to be a Molex #03-09 series. Terminators 25B and 25C could be any of the following manufacturer series:
AMP Universal Mate-N-Lok
Max. No. of pins 15
No. of inserts 16
Config. 2,3,4,5,6,9,12,15
AMP Mini-Universal Mate-N-Lok
Max. No. of pins 15
No. of inserts 14
Config. 2,3,4,6,9,12,15
AMP Commercial Mate-N-Lok
Max. No. of pins 15
No. of inserts 12
Config. 3,4,6,9,12,15
Amp Commercial Mate-N-Lok Matrix
Max. No. of pins 16
No. of inserts 10
Config. 6,8,10,12,16
MOLEX 03-06 Series (.062)
Max. No. of pins 36
No. of inserts 20
Config. 1,3,4,5,6,9,12,
MOLEX 15-31 Series (.062)
Max. No. of pins 15
No. of inserts 14
Config. 2,3,4,5,6,9,12,15,24,36
Molex 03-09 Series (.093)
Max. No. of pins 15
No. of inserts 18
Config. 1,2,3,4,5,6,9,12,15
Molex 19-09 Series (.093)
Max. No. of pins 9
No. of inserts 10
Config. 2,3,4,6,9
Molex 03-12 Series (.125)
Max. No. of pins 4
No. of inserts 8
Config. 1,2,3,4

This partial list of manufacturer's connectors is provided here to demonstrate how nine (9) master terminator blocks and associated inserts can accommodate 120 different connectors.

Figure 3A:
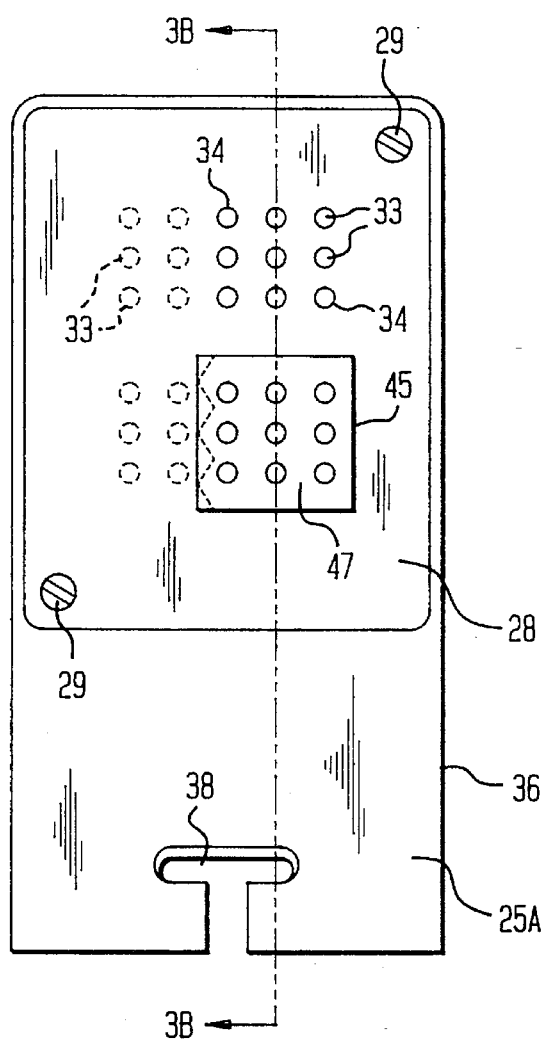
FIG. 3A is a front elevational view of the preferred embodiment of the universal termination module shown in FIG. 1.
Figure 3B:
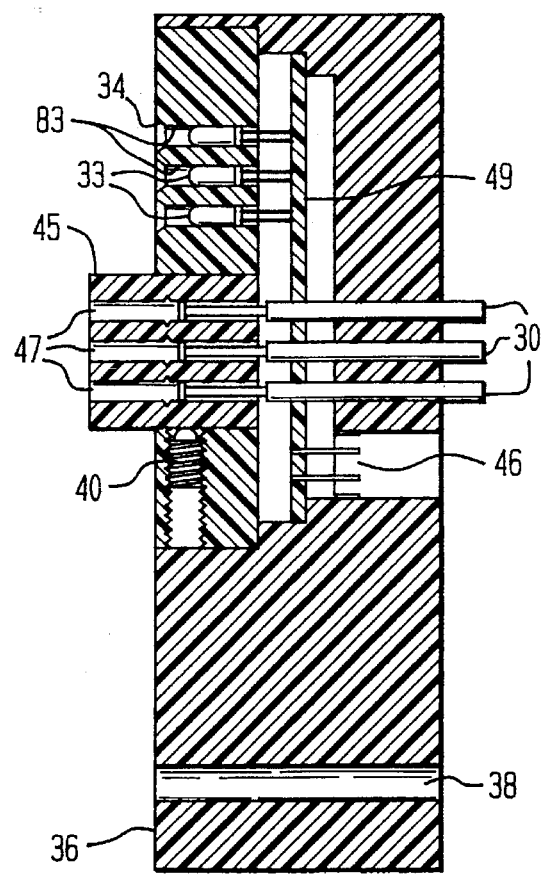
FIG. 3B is a side, cross-sectional view of the preferred embodiment of the universal termination module shown in FIGS. 1 and 3.

FIG. 3A illustrates a 9 pin MOLEX 03-09 harness connector 47 plugged directly into the connector docking or receptor cavity or aperture 45 in the face plate panel insert 28. Phantom circles depict the hidden, underlying, unused test pins and LEDs. Since this connector series has a maximum of 15 pins, the master block must also have the same number of test pins 30 and LEDs 33. The printed circuit board 49 is visible in cross-section in FIG. 3B. Also shown in cross-section in FIG. 3B are the test pins 30, which could be spring-loaded test probes as shown, or mating pins to the harness connector, or any means that allows the harness wire 69 with connector pin 81 to make electrical contact with the corresponding point on the printed circuit board 49. Note that the test probes 30 extend well into the harness connector cavity 45. The wired pin from the harness 61 presses against this test probe 30 causing it to compress until the wired pin snaps into its loaded position. Also note that the harness connector 47 actually resides in the receptor cavity or aperture 45 which has been molded into the interchangeable face plate insert panel 28.

Ball screw detent 40 shown in cross-section in FIG. 3B is to allow adjustable friction against the harness connector 47 so that it is not pushed out by the spring force of the spring loaded probes 30. Clearance holes 83 reside in the backside of the face plate insert panel 28 to clear unused pins 30 and for all LEDs 33. The LEDs are cleared for viewing by opening the location holes 34 in the front. All alignment between the test probes 30, LED 33, the face plate insert panel 28 and the inserted connector 47 are all controlled for match at the time the molds for the master block 36 and face plate insert panel 28 are made.

FIG. 4A and 4B illustrate an alternate embodiment 100. Essentially, in this embodiment, an extra component has been added. It is the mating connector to the harness connector 31. Some harness connector pins are extremely small, hard to reach, and are fragile. Therefore, the mating connector 31 is permanently, physically mounted on the face plate insert panel 28. It is better to employ the mating connector 31 as a bridge to get the electrical signal from the harness connector 47 to the electrical controller test system 18. Also, in this case, instead of using spring-loaded pins, the arrangement employs female pins in the terminator master block which capture male conductors from terminator connector 31. All other considerations of clearance, LED 33, printed circuit board 49 arrangement, etc., are the same as previously stated for the preferred embodiment 10.

FIG. 5A illustrates a typical interchangeable face plate insert panel 28 of the sort that can be used with the preferred embodiment 10 of the invention. Interchangeable panel 28 includes a docking aperture 45, which in this case, is specific to a Molex 12P series of harness connectors. FIG. 5B illustrates an embodiment of an interchangeable face plate insert panel 102 with a permanently attached mating connector 104 of the type that could be used with alternative embodiment 100.

While the invention 10 has been described with reference to the preferred embodiment thereof, it will be appreciated by those of ordinary skill in the art that various different changes can be made to the structure of the disclosed invention without departing from the spirit and scope of the invention as a whole.

I claim:

1. An electric wire harness assembly apparatus for assembling a plurality of wires into a harness including a first electrical multiconductor connector on at least one end thereof, said apparatus comprising:

a wiring surface having guide means for indicating the configuration of the harness to be assembled including the location of a plurality of harness terminations;

a plurality of termination modules each mountable on said wiring surface adjacent to a different one of the locations of said harness termination;

connector docking means for receiving a second multiconductor connector that mates with said first connector;

multi-pin means including a plurality of pins located in each of said termination modules for selectively contacting conductors in said second multiconductor connector;

panel means for selectively adjusting the number of pins to which said second connector will make electrical contact, said panel means including said connector docking means; and, electronic controller means electrically connected to said termination modules for selectively providing power to said conductors in said first and second multiconductor connectors through said multi-pin means.

2. The apparatus of claim 1 further comprising:

a plurality of visual indicators each mounted in one of said modules and also connected to said controller means, each of said visual indicators having means for indicating which one of the conductors in said first connector is to receive a harness wire during assembly.

3. The apparatus of claim 2 wherein said multi-pin means comprise a plurality of spring-loaded pins.

4. The apparatus of claim 3 wherein said panel means comprises a face plate receivable in each of said termination modules and wherein said connector docking means comprises an aperture in said face plate which will receive said second connector.

5. The apparatus of claim 4 further comprising:

hook and loop means for selectively attaching said termination modules to said wiring surface.

6. The apparatus of claim 5 wherein said visual indicators comprise an array of selectively energizable light means and wherein said face plate includes an array of holes therein to adjust the number of observable visible indicators to the number of pins available for wiring through said first and second multiconductor connectors.

7. The apparatus of claim 6 wherein said second connector is physically attached to said face plate.

8. The apparatus of claim 6 wherein said array of light means comprises an array of LEDs.

9. An electric wire harness assembly apparatus for assembling a plurality of wires into a harness including a first multiconductor electrical connector on at least one end thereof, said apparatus comprising:

a wiring surface having guide means for indicating the configuration of the harness to be assembled including the locations of a plurality of harness terminations;

termination module means mountable on said wiring surface adjacent to at least one harness termination location;

connector docking means for receiving a second multiconductor connector that mates with said first multiconductor connector;

multi-pin means including a plurality of pins located in said termination module means for selectively contacting conductors in said second multiconductor connector;

panel means for selectively adjusting the number of pins to which said second connector will make electrical contact, said panel means including said connector docking means; and, electronic controller means electrically connected to said termination module means to provide electrical power to said conductors in said first and second multiconductor connectors through said multi-pin means.

10. The apparatus of claim 9 further comprising:

a plurality of visual indicators mounted in said termination module means and also connected to said electronic controller means, each of said visual indicators having means to indicate which one of the first connector conductors is to receive a harness wire during assembly.

11. The apparatus of claim 10 wherein said multi-pin means comprises a plurality of spring-loaded pins.

12. The apparatus of claim 11 wherein said panel means comprises a face plate receivable in said termination module means and wherein said connector docking means comprises an aperture in said face plate that will receive said second connector.

13. The apparatus of claim 12 further comprising:

hook and loop means for selectively attaching said termination module means to said wiring surface.

14. The apparatus of claim 13 wherein said visual indicators comprise an array of selectively energizable light means and wherein said face plate includes an array of holes therein to adjust the number of observable visible light means to the number of pins available for wiring through said first and second multiconductor connectors.

15. The apparatus of claim 14 wherein said second connector is physically attached to said face plate.

16. The apparatus of claim 14 wherein said array of light means comprises an array of LEDs.

17. In an electrical wire harness assembly apparatus for assembling a plurality of wires into a harness having a first multiconductor connector on at least one end thereof, said apparatus further including a wiring surface having guide means for indicating the configuration of the harness to be assembled including the locations of a plurality of harness terminations; termination module means located on said wiring surface adjacent to at least one harness termination location; and, electronic controller means connected to said termination modules, said improvement comprising:

multi-pin means located in said termination module means, interchangeable face plate means receivable in said termination module means and having an aperture therein which receives a second multiconductor connector which mates with said first connector and which includes a plurality of conductors which selectively contact said multi-pin means, and wherein different interchangeable face plate means can be received in the same termination module means in order to accommodate different types of first multiconductor connectors.

18. The apparatus of claim 17 wherein said multi-pin means comprises a plurality of spring-loaded pins.

19. The apparatus of claim 18 further comprising:

a plurality of visual indicators each mounted inside of said termination module means and also connected to said electronic controller means; and, an array of holes located in said face plate means and located adjacent to said visual indicators, wherein the number of visual indicators observable through said face place means is substantially equal to the number of conductors in said first and second connectors, and, wherein said electronic controller means selectively illuminates said visual indicators to indicate to a harness wire assembler where to place a wire during assembly of a wire harness.

20. The apparatus of claim 19 wherein said second connector is physically attached to said face plate.

* * * * *